United States Patent [19]

Egami et al.

[11] Patent Number: 5,846,323
[45] Date of Patent: Dec. 8, 1998

[54] CRYSTAL MANUFACTURING APPARATUS

[75] Inventors: Masahiro Egami, Tokyo; Yuh Shiohara, Chigasaki; Yasuo Namikawa, Osaka, all of Japan

[73] Assignees: International Superconductivity Technology Center, the Juridical Foundation; Ishikawajima-Harima Heavy Industries Co. Ltd., both of Tokyo; Sumitomo Electric Industries, Ltd., Osaka, all of Japan

[21] Appl. No.: 725,939

[22] Filed: Oct. 8, 1996

[30] Foreign Application Priority Data

Oct. 11, 1995 [JP] Japan ................................ 7-263283

[51] Int. Cl.[6] .................................................. C30B 35/00
[52] U.S. Cl. ........................... 117/217; 117/208; 117/222
[58] Field of Search ..................... 117/200, 201, 117/202, 208, 217, 222

[56] References Cited

U.S. PATENT DOCUMENTS

| | | | |
|---|---|---|---|
| 3,701,636 | 10/1972 | Labelle, Jr. et al. | 117/217 |
| 4,314,128 | 2/1982 | Chitre | 117/217 |
| 4,957,713 | 9/1990 | Kraretsky et al. | 117/210 |

*Primary Examiner*—Felisa Garrett
*Attorney, Agent, or Firm*—Pearne, Gordon, McCoy and Granger LLP

[57] ABSTRACT

A crystal pulling apparatus is designed to generate a thermal gradient across the melt surface to prevent nucleation of stray crystals and production of floating debris to produce a high quality crystal, and has special provisions for observing the growth behavior and crystal dimension measurements. The apparatus includes a cylindrical chamber, a crucible disposed centrally within the chamber, a cylindrical heater surrounding the crucible, an insulation member disposed on the top section of the crucible, a first transparent plate and a second transparent plate for closing the center hole in the insulation member, a pull rod passing through the center hole of the transparent plates, a crystal illumination mechanism, a crystal size determination mechanism and an ambient atmosphere flowing mechanism. The crystal size determination mechanism is provided with a quartz prism, an infrared transmitting filter on a side wall of the chamber, a revolution count circuit, phase angle setting circuit, a CCD camera, an image processing section, and a crystal size determination device having a TV monitor.

15 Claims, 10 Drawing Sheets

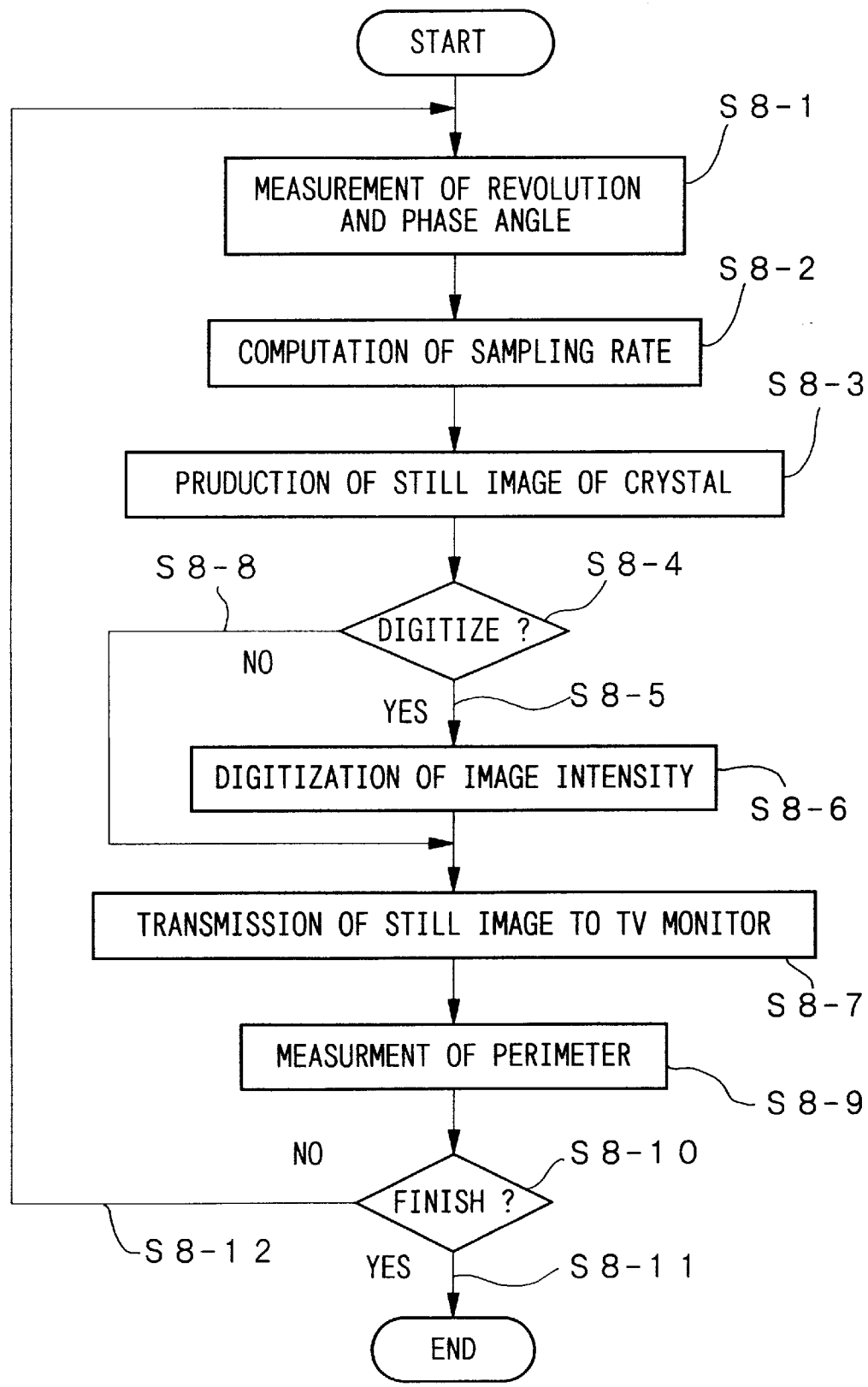

TV MONITOR

DETERMINATION OF BOUNDARY

COMPUTATION OF LENGTH

DETERMINATION OF APEX $$l_1 = \sqrt{(x_2 - x_1)^2 + (y_1 - y_2)^2}$$
$$l_2 = \sqrt{(x_3 - x_2)^2 + (y_3 - y_2)^2}$$

CRYSTAL MANUFACTURING APPARATUS

BACKGROUND OF THE INVENTION

1. Field of the Invention

The present invention relates in general to a pulling-type crystal manufacturing apparatus, and relates in particular to a crystal pulling apparatus suitable for use in producing a crystal of a high temperature oxide superconductor material.

2. Description of the Related Art

In recent years, there has been active research into high temperature oxide super-conducting materials especially into those systems having a high critical temperature above the liquid nitrogen temperature, typified by the Y—Ba—Cu—O system. Presently, some of these superconducting materials are being evaluated for applications in superconducting devices. A special problem in making these materials in a thin film form is that the lattice mismatch between the single crystal substrate material and the thin film superconductor material affects the performance of the device significantly, and therefore, the selection of the single crystal of the substrate material and the development of a process for producing a high quality large diameter single crystal have become a very important subject matter.

Crystal pulling is an effective technique of growing a large single crystal under controlled the conditions of growth. In the past, almost all of the high temperature oxide superconducting materials has been carried out using some type of crystal pulling apparatus. The crystal pulling apparatus broadly comprises a furnace section and a drive mechanism for pulling up a crystal. The method of operation is broadly as follows: a seed crystal is attached to the bottom end of a pulling rod located within the furnace section, next the seed crystal is made to touch the surface of a molten solution of the superconductor material held in a crucible, and the seed crystal is rotated and pulled up so that a crystal can be grown on the seed crystal. From time to time during the growth process of the single crystal, it is necessary for the apparatus operator to observe the manner and progress of crystal growth, and in the conventional apparatus of this type, a small peek window is provided on the side wall of the furnace section to permit observation of the growth behavior of the crystal. If it is necessary to measure the dimension of the grown crystal, measurements are taken from an image of the crystal produced on a monitoring screen provided for the apparatus.

In the type of apparatus described above, because of the presence of the peek window on the side wall of the furnace section, there is a loss of heat from the furnace interior during the growth process of the single crystal. For comparatively large furnaces, the effects of this loss of thermal energy through the peek window on the growth behavior is negligible relative to the overall large heat capacity of the furnace section. However, for small apparatus such as those used in research, effects of the loss of heat from the peek window can not be neglected. This is because, for growing of single crystal of a multi-component system, especially for high temperature oxide systems such as Y—Ba—Cu—O, common phenomenon of stray crystals nucleating on the surface float on the melt surface is observed. The presence of the peek window increases the formation of the floating stray crystals, thus making it difficult to grow the single crystal continuously.

Furthermore, it has been discovered that it is necessary to increase the temperature difference in the horizontal direction on the surface of the melt (hereafter referred to as the temperature gradient) for growing a high quality crystal. However, the conventional apparatus is designed so as to insulate the upper portion the furnace section for retention of heat, and consequently, it has been difficult to increase the temperature gradient. It follows therefore that the conventional apparatus inherently presented a problem that the stray crystals nucleated around the growing single crystal gradually increase in number during the subsequent growth process of the single crystal.

An additional problem in the conventional apparatus is that, as the growth process is continued, the peek window becomes fogged by the vapor released from the melt thus making it difficult to observe the growth behavior over a long period of time. In the case of yttrium-based high temperature oxide system, such as Y—Ba—Cu—O, the single crystal grows in a square shape reflecting the anisotropic nature of the structure of the material, and it has not been possible to perform size measurements of the growing crystal using the conventional monitor.

SUMMARY OF THE INVENTION

It is an object of the present invention to provide a crystal growing apparatus which enables growth of a high quality single crystal by suppressing the formation of floating debris by preventing nucleation of stray crystals as well as to enable observation and the measurements of the size of growing crystal.

The object is achieved in a crystal manufacturing apparatus comprising: a cylindrical chamber having a crucible disposed coaxially within a chamber space; a cylindrical heater coaxially surrounding said crucible; an insulation member having a center hole disposed so as to divide said chamber into upper and lower sections; a transparent plate having a center hole disposed on said insulation member so as to cover over said center hole of said insulation member; and a pulling rod disposed centrally in said cylindrical chamber so as to pass through said center hole of said transparent plate.

In addition to the elements presented above, it is also permissible to provide a crystal illumination mechanism to illuminate the growing crystal, and crystal size determination mechanism to measure the size of the crystal when the shape is non-circular. The actual elements of the crystal illumination mechanism are a visible light source for emitting visible light; a glass fiber transparent to said visible light, whose one end is in optical contact with said light source; an illumination plate attached to other end of said glass fiber; a sapphire fiber optically aligned with said illumination plate in an non-contacting manner to transmit said visible light; and a cooling tube surrounding said glass fiber for permitting water to circulate for cooling said glass fiber. The actual elements of the crystal size determination mechanism are an optical path changing means for altering an optical path of infrared radiation emitted from said growing crystal and said melt and an optical path of said visible light and passed though said transparent plate; a crystal size determination device for measuring and determining dimensions of said growing crystal by receiving infrared radiation and reflected light which passes through said optical path changing device to form an image of said growing crystal, outputs said image and measurement data of said growing crystal.

The optical path changing means can be made of a prism having a slit for allowing the pull rod to pass through. The actual construction of the crystal size determination mechanism are an electro-optic recording device for receiving infrared radiation and reflected light which have passed through said optical path changing means so as to form an image of said growing crystal; an image processing section for sampling said image of said growing crystal in synchronization with a rotational speed of said pulling rod so as to form a still image of said growing crystal; and an output device for outputting results of image processing produced by said image processing section. It is also permissible to provide a phase angle setting device for setting a phase angle for a revolving growing crystal. The crystal size determination device may utilize an infrared transmitting filter between the optical changing device and the recording device such as a camera.

An ambient atmosphere sweeping device may be provided for admitting an ambient atmosphere from a top region and discharging from a bottom region of said chamber. In this case, it is desirable to provide fins in at-least the region of said pull rod passing through the transparent plates. It is also possible to provide a first transparent plate on a bottom section of said insulation member and a second transparent plate on a top section of said insulation member acting as a thermal insulation to said first transparent plate. In this case, said first transparent plate consists of a U-shaped first piece and a fan-shaped second piece having a pick-up bar.

The feature of the present apparatus is that thermal distribution is carefully controlled. The crucible exterior is surrounded with a heater, and the top region is covered with an insulation member having a center hole, therefore, during the crystal growing operation, there is considerable heat loss through the transparent plate covering the center hole of the insulation member. In this instance, the apparatus compensates for the heat loss and achieves the required temperature for crystal growth by supplying the lost heat through the heater, thereby compensating a large heat loss through the transparent plates by a large quantity of heat from the heater. Therefore, the temperatures of the outer periphery of the crucible and the bottom region of the insulation member rise compared with the center region of the crucible, thus producing a large temperature gradient in the melt contained in the crucible. The result is that, compared with the conventional design of the pulling furnace, it becomes possible to control the increase in the number of stray crystal nucleation and floating debris, thereby improving the quality of the crystal produced. In addition to these features, the transparent plates serve as peek window to enable observation of the behavior of the growing crystal.

Additional features include the novel crystal illumination and crystal size determination mechanisms to enable determination of the size of the growing crystal even when the shape is non-circular, by utilizing infrared radiation emitted from the high temperature crystal and the melt or visible light generated from the illumination device and reflected from the crystal. For example, when it is necessary to measure the perimeter length of a square-shaped crystal, the image processing section samples the crystal image in synchronization with the rotational speed of the growing crystal. By doing so, it becomes possible to generate a still image of the square-shaped growing crystal, and the still image can be numerically processed to compute the perimeter length.

Also, when the apparatus is provided with ambient atmosphere sweeping means, the ambient atmosphere flows from the top region to the bottom region of the apparatus. By providing fins in the portion of the pull rod which passes through the transparent plates, the atmosphere passing downwards through the space between the pull rod and the center hole of the transparent plates, the rotational action of the fins makes the gas to flow from the center region toward the outer region of the plates underneath the plates. This action of the gas flow ensures that only the atmosphere gas containing no vapors from the melt will pass over the bottom of the plates. By providing the second transparent plate above the first transparent plate, the second transparent plate acts as a thermal insulator to the first transparent plate thereby perverting the condensation of vapors released by the melt.

BRIEF DESCRIPTION OF THE DRAWING

FIG. 8 is a flowchart for crystal size determination process;

DESCRIPTION OF THE PREFERRED EMBODIMENTS

The embodiments of the present apparatus will be explained below with reference to the drawings provided in FIGS. 1 to 10D inclusively.

Figure 1:
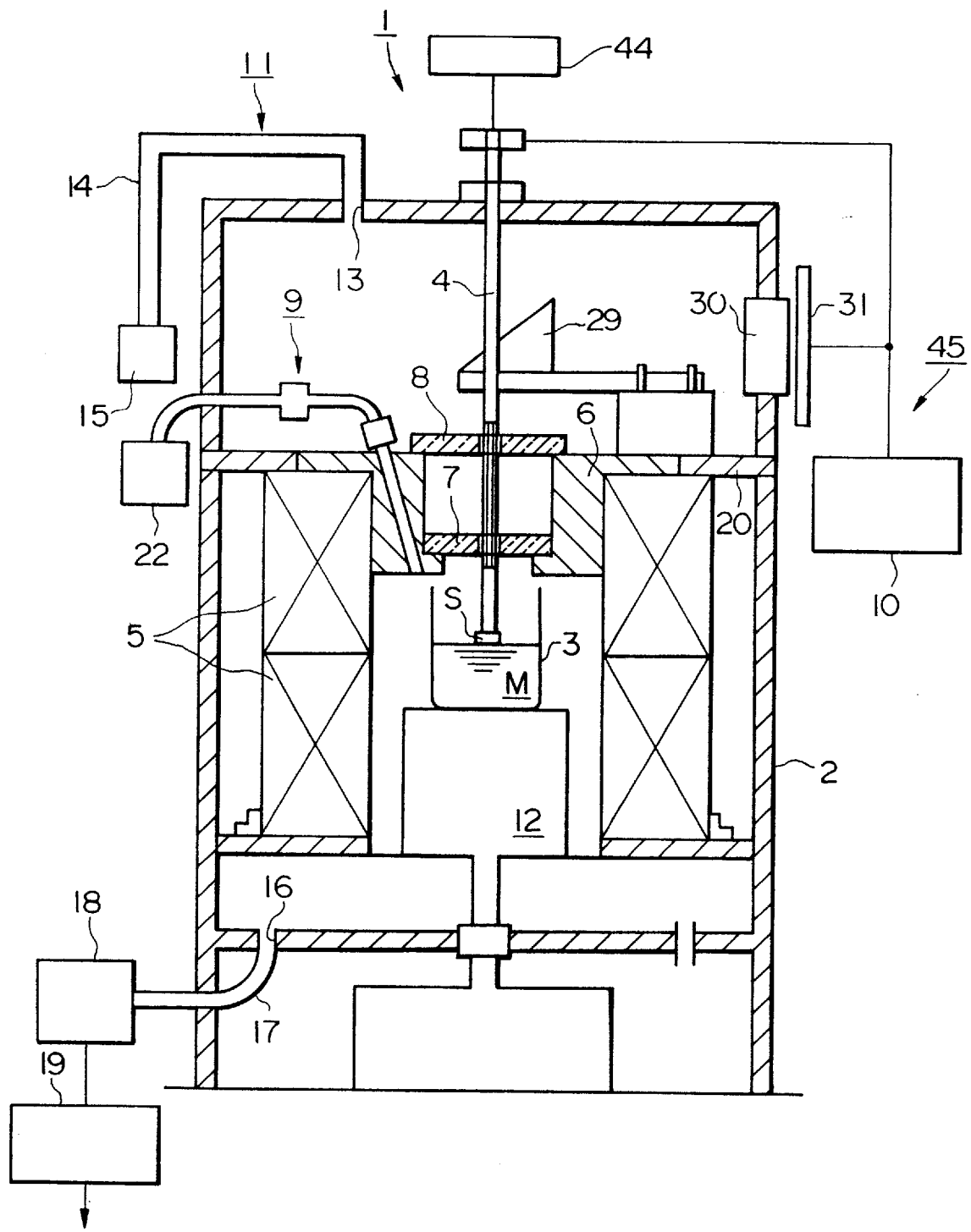
FIG. 1 is a cross sectional side view of a first embodiment of a crystal growing apparatus of the present invention.

FIG. 1 shows the overall construction of the crystal growing apparatus (shortened to apparatus hereinbelow). The apparatus 1 is suitable for making a square shaped single crystal having a perimeter dimension of about two inches of such high temperature oxide superconducting systems as Y—Ba—Cu—O. The apparatus comprises: a chamber 2; a crucible 3; a pulling rod 4; a heater 5; thermal insulation 6; a first transparent plate 7; a second transparent plate 8; a crystal illumination device (crystal illumination means) 9; a crystal size determination mechanism (crystal size determination means) 45; and an ambient atmosphere sweeping mechanism (ambient atmosphere sweeping means) 11.

As shown in FIG. 1, stainless steel is used to form a cylindrical chamber 2. In the lower portion of the chamber 2, there is a support base 12 so that the crucible 3 can be placed in the center of the chamber 2. The pulling rod 4 is disposed along the central axis of the chamber 2, and the top portion of the pulling rod 4 extends upwards through the top of the chamber 2 and is connected to a pulling device 44 which raises the rod while simultaneously rotating it at their respective speeds.

At the top of the chamber 2, there is an entry port 13 for the ambient atmosphere which is supplied from a gas supply source 15 through a delivery pipe 14. The gas supply source 15 is used to supply a gas mixture containing such gases as argon, nitrogen mixed with oxygen to the chamber 2. At the bottom of the chamber 2, there is an exhaust port 16 which is connected through a pipe 17 to a pump 18 and oxygen monitor 19 in succession. The pump 18 is used to exhaust the interior atmosphere from the chamber 2, and the oxygen monitor 19 is used to check the oxygen level in the ambient atmosphere which affects the crystal growing behavior. The ambient atmosphere sweeping mechanism 11 is thus comprised of the elements described above, thereby allowing the gas to sweep through the chamber 2 from the bottom to the top thereof.

Figure 2:
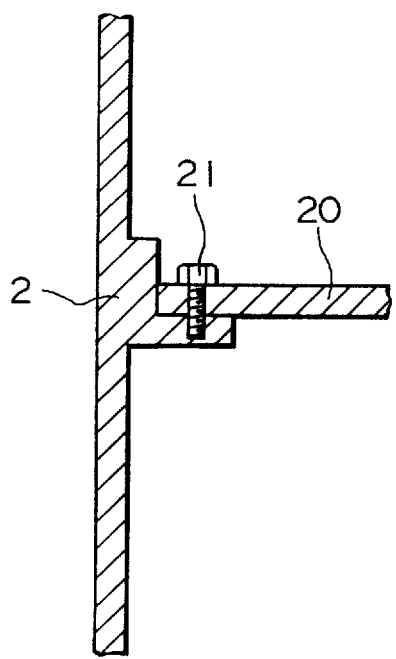
FIG. 2 is a cross sectional side view of a partition plate of the crystal growing apparatus.

As shown in FIG. 2, a ring-shaped divider plate 20 is fixed to the side wall of the chamber 2 by means of a fastener 21, and as shown in FIG. 1, a ring-shaped insulation member 6 is attached to the opening of the divider plate 20. The insulation member 6 is made of such thermal insulation materials as $Al_2O_3$ and CaO. The interior space of the chamber 2 is divided into two spaces, a top space and a bottom space, by means of the divider plate 20 and the insulation member 6. In the bottom space, a cylindrical heater 5 surrounding the crucible 3 is disposed coaxially with the chamber 2. The heater 5 is a resistance heating type for radiatively heating of the melt M in the crucible 3.

Figure 3A:
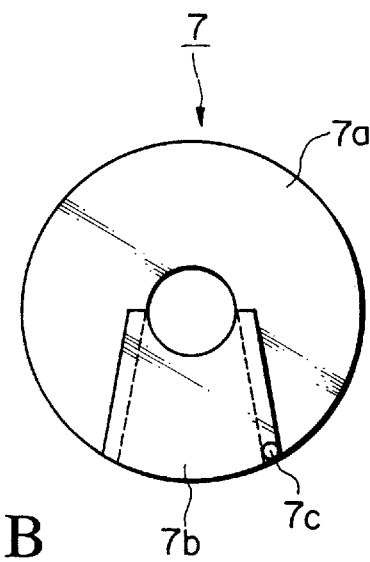
FIG. 3A is a plan view of a first transparent plate of the apparatus.
Figure 3B:
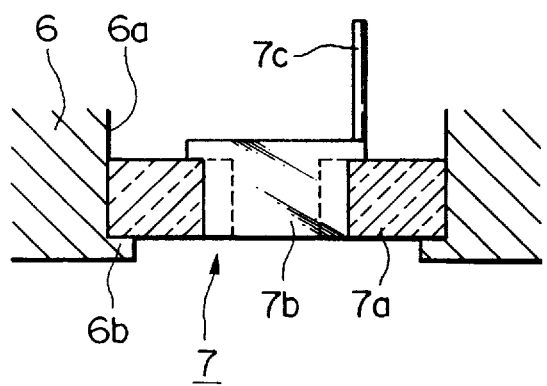
FIG. 3B is a cross sectional view of the transparent plate.

As shown in FIG. 3B, an inwardly protruding protrusion section 6b is formed on the lower end of the center hole 6a of the insulation member 6, and a first transparent plate 7 is placed on top of the protrusion section 6b. The first transparent plate 7 is made of sapphire, and transmits visible light and a part of the infrared light. As shown in FIG. 3A, the first transparent plate 7 is divided planarly into two plate pieces, along a portion of the circumference, to result in a first piece 7a which is a U-shaped piece and a second piece 7b which is a fan-shaped piece. A pick-up handle 7c having a length longer than the width of the second piece 7b is attached, as seen in FIG. 3B, to a circumferential end of the second piece 7b.

The reason for dividing the transparent plate 7 into two pieces is to enable placing the transparent plate 7 on top of the insulation member 6 while the pull rod 4 is being firmly positioned. The particular shapes of the pieces are chosen because if the plate 7 is split in half, a semicircular-shaped may fall through the center hole 6a of the insulation member 6. The process of installing the pieces is to place the first piece 7a first followed by picking up the second piece 7b by means of the pick-up rod 7c, thus enabling to position the first transparent plate 7 while avoiding any danger of dropping either of the two pieces 7a, 7b.

Returning to FIG. 1, a second transparent plate 8 is provided on the top surface of the insulation member 6. The second transparent plate 8 is made of quartz glass, and this material also transmits visible light and a part of the infrared light. The second transparent plate 8 may also be divided into smaller pieces as in the case of the first transparent plate 7. The reason for using sapphire for the first transparent plate 7 and quartz glass for the second transparent plate 8 is that the first transparent plate 7 comes into a direct contact with the vapor from the melt so that a corrosion-resistant sapphire plate is needed while the second transparent plate 8 does not come into contact with the vapor, and quartz glass is sufficient for the purpose.

Figure 4A:
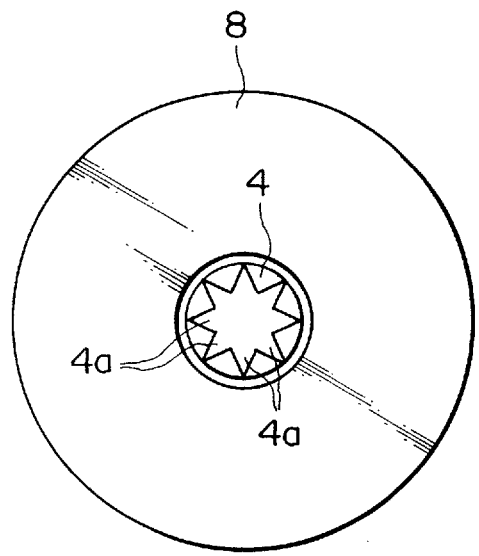
FIG. 4A is an enlarged view of the portion where the pulling rod passes through the transparent plate.
Figure 4B:
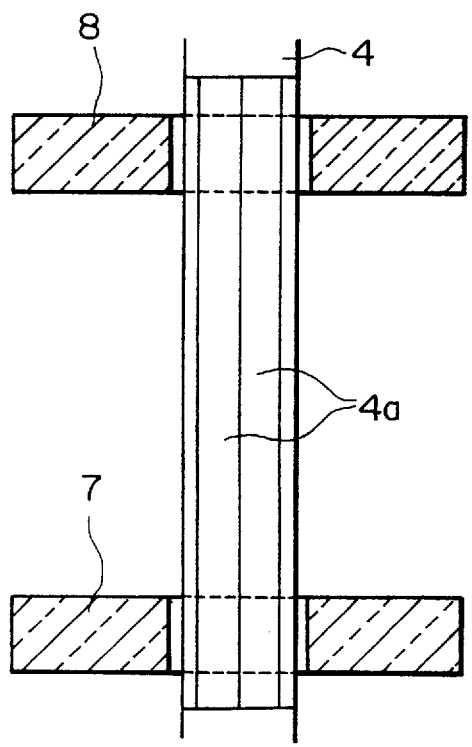
FIG. 4B is a cross sectional view of the section shown in FIG. 3A.

The overall cross sectional shape of the pull rod 4 is circular except for the region which is located within the first and second transparent plates 7, 8, as shown in FIG. 4B; in this region of the pull rod 4, the cross sectional shape is as illustrated in FIGS. 4A, which is a star-shaped cross section having a series of fins 4a (in this example, there are eight fins).

Figure 5:
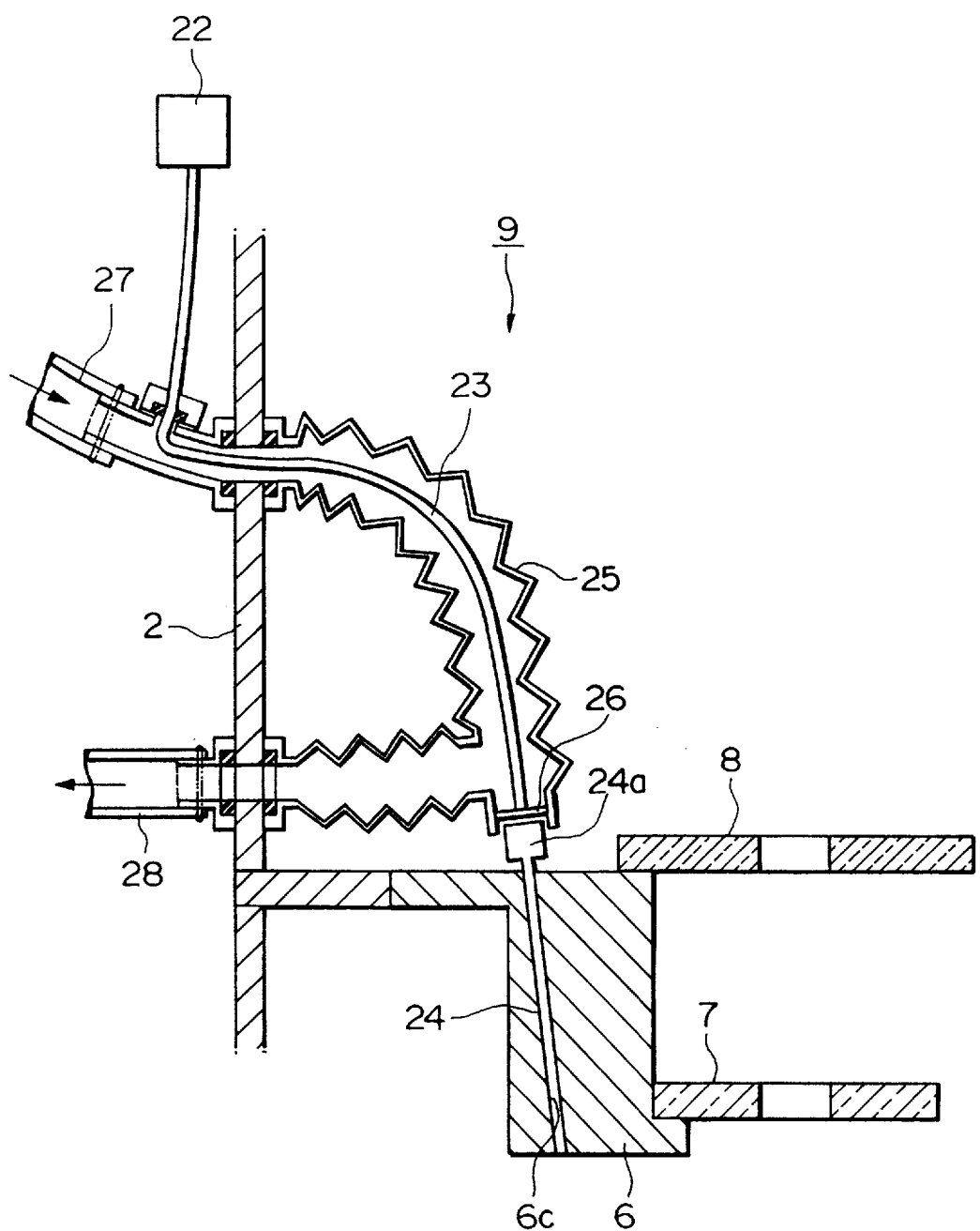
FIG. 5 is a cross sectional side view of the crystal illumination device of the apparatus.

The apparatus 1 is additionally provided with a crystal illumination device 9 in FIG. 5 and a crystal size determination mechanism 45. The crystal illumination device 9 comprises: a visible light source 22; a glass fiber 23; a sapphire fiber 24; a bellows 25 (cooling pipe); and a transparent plate 26, as shown in FIG. 5. One end of the glass fiber 23 is in optical contact with the visible light source 22 disposed exterior to the chamber 2. The transparent plate 26 is firmly attached to the end of that section of the bellows 25 which is located in the interior of the chamber 2, and the other end of the glass fiber 23 is fixed to the transparent plate 26. The sapphire fiber 24 having a diameter of about 2 mm is passed through the interior passage of an insulation hole 6c. One end of the sapphire fiber 24 has an expanded section 24a, so as to prevent falling through the passage, which opposes the tip end of the glass fiber 23 without touching.

A cooling water inlet pipe 27 and an outlet pipe 28 are connected to the bellows 25 for cooling the exterior portion of the chamber 25 so that the water circulating through the bellows 25 can provide cooling to the glass fiber 23. The crystal illumination device 9 is thus constructed to prevent damage to the constituting members from thermal distortion from the heat of the upper section of the chamber 2, by the combined properties flexibility of the bellows 25, non-contacting arrangement of the transparent plate 26 and the sapphire fiber 24 as well as the cooling provided for the glass fiber 23.

Figure 6:
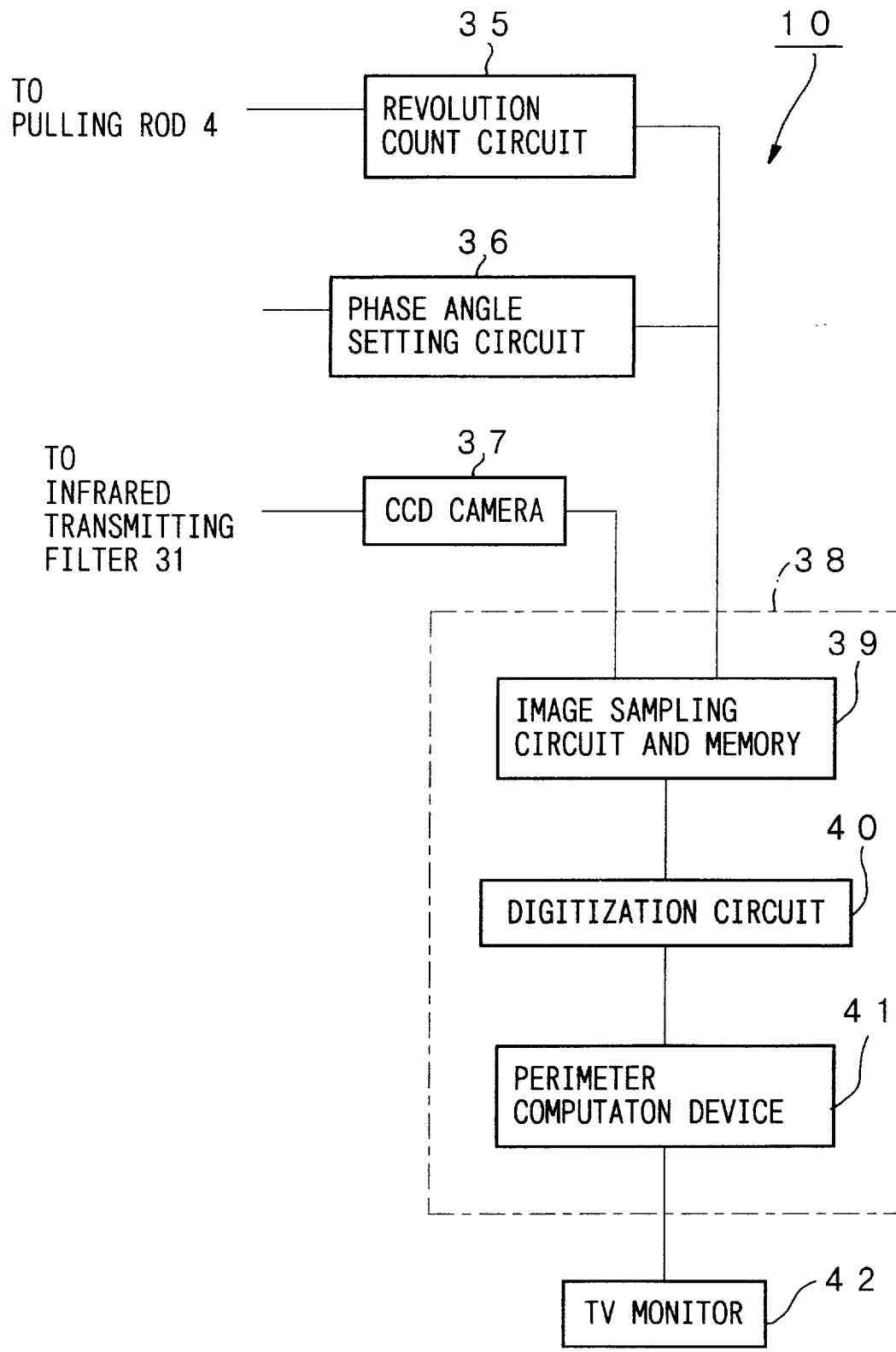
FIG. 6 is a block diagram of the crystal size measurement device.

The crystal size determination mechanism 45 comprises: a quartz prism 29 (optical path changing means) disposed in the interior of the chamber 2, as shown in FIG. 1; a quartz window 30 disposed on the vertical wall of the chamber 2; an infrared filter 31; and a crystal size determination device 10, shown in FIG. 6. The crystal size determination mechanism 45 used in this embodiment produces an image of the crystal on the basis of in either the difference in the reflective intensities of visible light (from the visible light source 22) and reflected from crystal and the melt surfaces, or the difference based on the radiative efficiencies of the infrared radiation emitted from the crystal and the melt.

More specifically, what is meant by the difference in the radiative efficiencies is that when light is emitted from a hot body, for example about a 1,000° C. body, the frequency of the maximum intensity is shifted to the infrared region compared to the case of visible light, and the radiation intensity is dependent on the physical state (solid or liquid) of the substance emitting the radiation. It follows that even if the crystal and the melt are at the same temperature, it becomes possible to distinguish whether the source of the radiation is a solid or liquid, depending on the radiative efficiency of the emitted radiation. When the crystal size determination mechanism 45 utilizes infrared radiation, the image can be further made clear by placing an infrared transmitting filter 31 in the optical path.

Figure 7A:
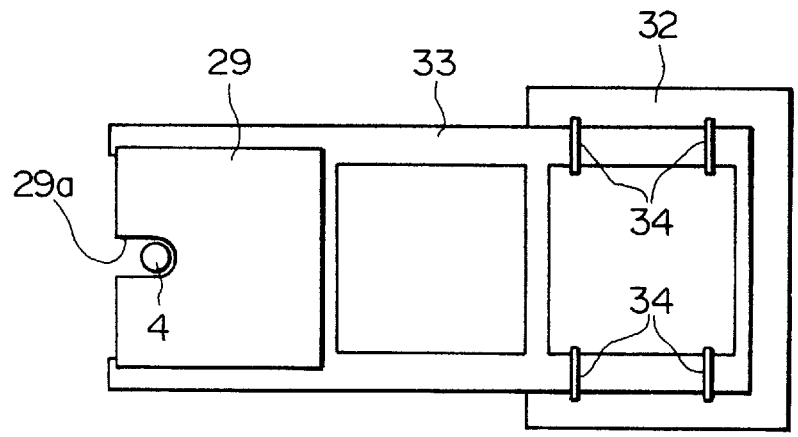
FIG. 7A is a plan view of a support structure for a quartz prism of the apparatus.
Figure 7B:
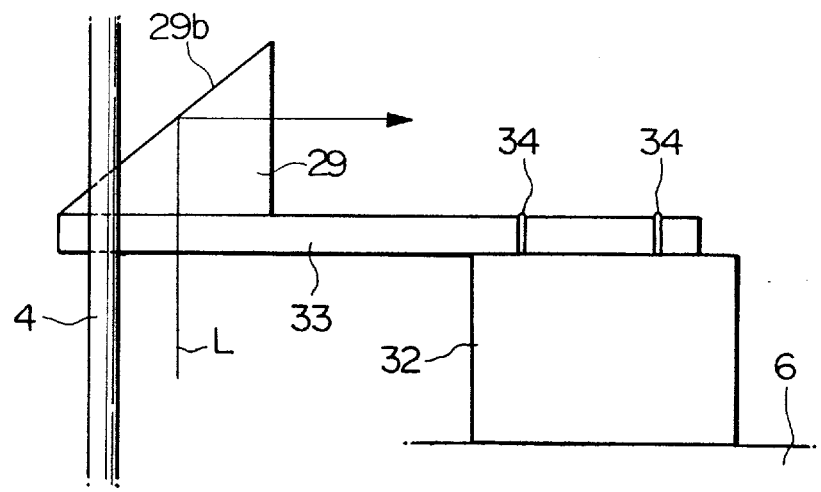
FIG. 7B is a side view of the structure shown in FIG. 7A.
Figure 7C:
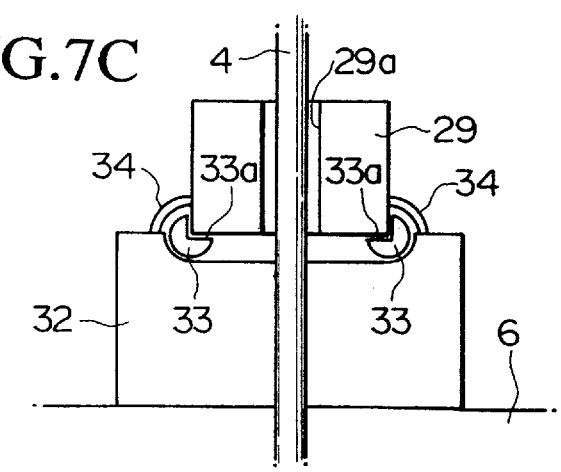
FIG. 7C is a front view of the structure shown in FIG. 7A.

FIGS. 7A–7C show the support structure for a quartz prism 29. As shown in FIG. 7B, the prism 29 is held on a prism holder 33 which is fixed on a holder base 32 which is fixed to the top surface of the insulation member 6. The cross sectional shape of the prism 29 is a right angle triangle, and is positioned so that one plane of the triangle is parallel to the prism holder 33. As shown in FIG. 7A, a slit 29a is formed on one surface of the prism 29 so as to be parallel to the pull rod 4 which passes through the slit space with a slight spacing therebetween. This manner of construction permits the prism 29 to be installed or removed while the pull rod 4 is firmly position in the apparatus 1. A beam of infrared light L entering from the bottom of the prism 29 along the pull rod 4 is reflected on a prism surface 29b and propagated in a direction parallel to the prism holder 33.

The prism holder 33 is made of alumina pipes in a ladder-like shape, as illustrated in FIG. 7A. The prism 29 is fixed in place on the prism holder 33 in a manner shown in FIG. 7C by slitting the inside top portions of the two opposing alumina pipes, and fixing the prism 29 in the seat section 33a thus formed. The bottom portion of the prism holder 33, opposite to the area where the prism 29 is fixated, is firmly held in place on the holder base 32 by means of wires 34 and adhesive.

The crystal size determination device 10, shown in FIG. 6, comprises: a revolution count circuit 35; a phase angle setting circuit 36; a CCD camera 37 (electro-optic recording device); an image processing section 38; and a TV monitor 42 (output device). The pull rod 4 is connected to the revolution count circuit 35 which is used to measure the number of revolutions of the pull rod 4. The phase angle setting circuit 36 is for setting the phase angle of the rotating crystal. In the stage following the infrared transmitting filter 31, there is disposed a charge coupled device (CCD) camera 37 to capture the image of the growing crystal. The revolution count signals from the revolution count circuit 35, the phase angle signals from the phase angle setting circuit 35 and the image data from the CCD 37 camera are forwarded to an image processing section 38 which is explained in the following.

The image processing section 38 comprises a image sampling circuit and memory 39, a binary processing circuit (digitization circuit) 40 and a perimeter computation device 41. The image sampling circuit and memory circuit 39 performs image sampling which is synchronized to the rotational speed of the pull rod 4, and in some cases, the sampling period is shifted by an amount equal to a phase angle and stores a still image thus generated. The digitization circuit 40 is for binary conversion of each point in the still image of the growing crystal in accordance with a certain threshold value. The perimeter computation circuit 41 is for computation of two perimeters of a square-shaped crystal. In the stage following the image processing section 38, there is a TV monitor 42 for outputting the image of the growing crystal and the results of the perimeter computation process.

The method of operating the apparatus 1 will be explained next.

First, feed materials for growing the crystal are charged into the crucible 3. Next, the heater 5 is turned on to heat the crucible 3. Next, the pull rod 4 having a seed crystal mounted at the bottom end, the first and second transparent plates 7, 8 and the prism 29 and all other operating components are arranged in place. After the melt M reaches a certain temperature, the drive mechanism is operated to rotate the seed crystal S which is lowered to touch the surface of the melt M. After this step, the seed crystal S is pulled up while being rotated, at a rotational speed of 10~100 r.p.m. and the pulling speed of about 0.1 mm/hr for example. This process produces a square-shaped crystal at the end of the seed crystal S. In this case, the ambient atmosphere is made to flow from the top region to the bottom region of the chamber 2 from a gas supply source 15, and by means of a pump 18, the gas is made to discharge from the chamber 2 at a velocity of about 500 cm$^3$/min, thus flowing the ambient gas through the chamber from the top section to the bottom section of the chamber 2.

For observing the growth behavior of the crystal and determining the size of the crystal, the intensity difference based on the difference in radiative efficiencies of the solid/liquid bodies is used, or the intensity difference in the reflected visible light generated by the crystal illumination mechanism 45. The perimeter measurements are computed automatically, and the image of the growing crystal and the perimeter data are output on the TV monitor 42. Next, the steps for the data processing by the crystal size determination mechanism 45 will be explained with reference to a flowchart shown in FIG. 8.

The revolution count of the pull rod 4 is measured by the revolution count circuit 35, and a suitable phase angle for the growing crystal selected by the phase angle setting circuit 36 are forwarded to the image sampling circuit 39 (step S8-1). In the meantime, reflected visible light or infrared radiation is injected into the CCD camera 37 after passing through the first and second transparent plates 7, 8, the prism 29 and the window 30 (if infrared radiation is used, an infrared transmitting filter 31 is included in the stage after the window 30). Then the CCD camera 37 captures an image of the region of the melt including the growing crystal and outputs the image data to the image sampling circuit 39.

The image sampling circuit 39 receives the revolution count signal and the phase measurement signal, and computes a sampling rate synchronized to the rotational speed of the pull rod 4 (step S8-2). The image sampling circuit 39 produces a still image of the growing crystal by inputting the image signal delivered at the sampling rate (step S8-3). The still image produced is stored in the memory 39. Next, the operator decides whether to undertake binary conversion step (step S8-4). If the binary conversion step is to be carried out (step S8-5), the digitization circuit 40 converts the image intensity of every point in the still image according to a certain threshold value (step S8-6) and forwards the still image to the TV monitor 42 (step S8-7).

If the binary conversion step is not be undertaken (step S8-8), the still image is directly forwarded to the TV monitor 42 (step S8-7). It should be noted that when the digitization is carried out, delicate shades of the still image are lost, and the image becomes one of simple black and white spots, thereby decreasing the information contained in the still image. Therefore, to carry out accurate observation, the digitization step should be stopped, as necessary as indicated in the flowchart, so as to confirm the quality of the image displayed on the monitor.

Figure 9:
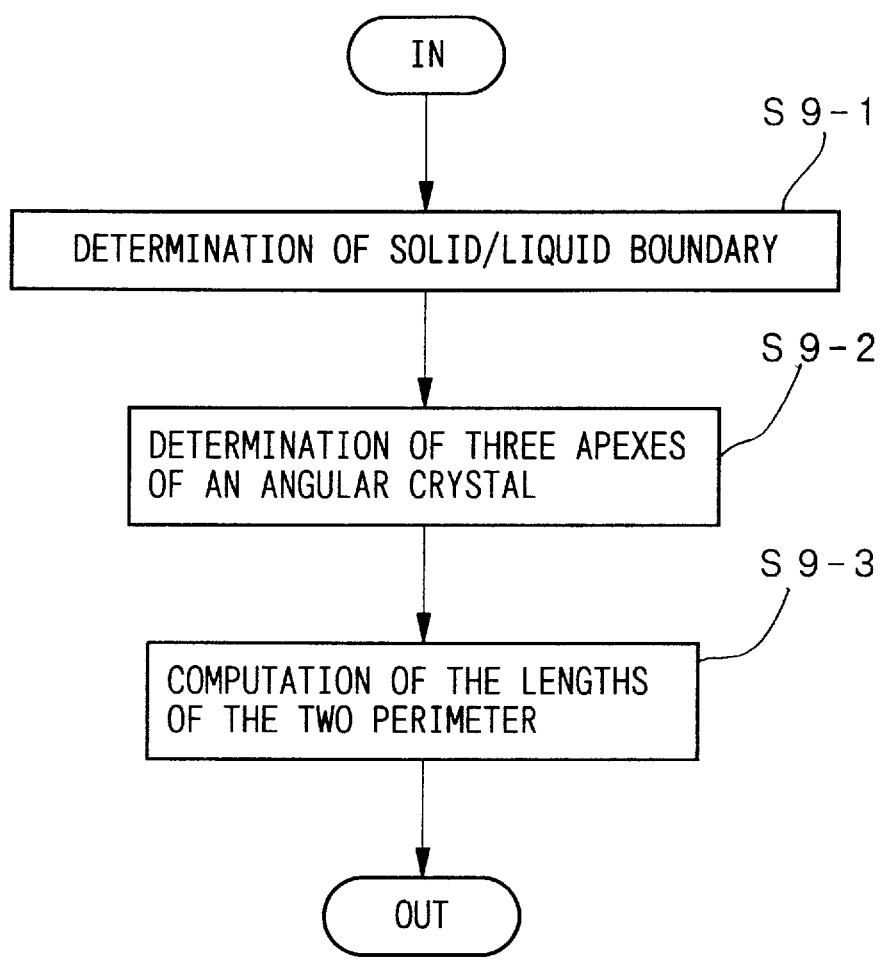
FIG. 9 is a portion of the flowchart shown in FIG. 8 which determines the perimeter length.
Figure 10A:
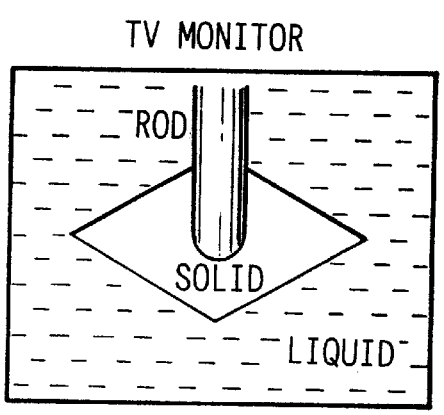
FIGS. 10A–10D are schematics to explain the process of determining the perimeter length.
Figure 10B:
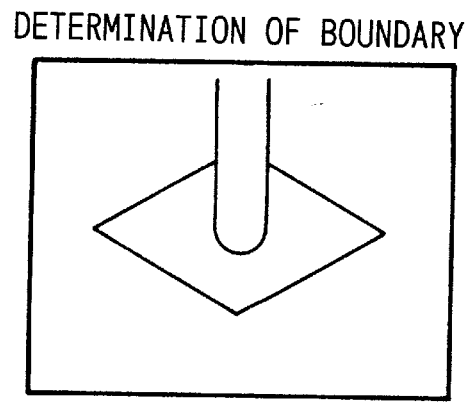
Figure 10D:
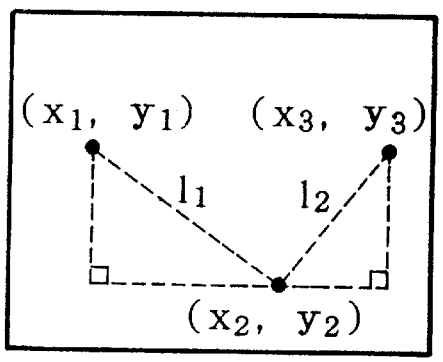
Figure 10C:
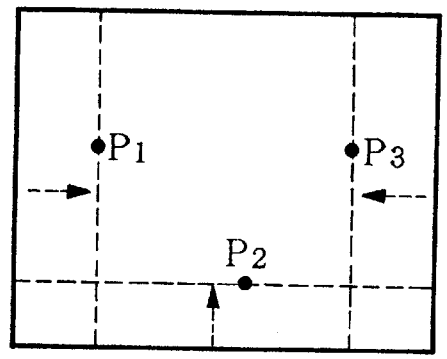

After sending the image to the TV monitor 42, the perimeter measurements are undertaken according to the flowchart shown in FIG. 9 (step S8-9). First, based on the image on the TV monitor 42 as illustrated in FIG. 10A, the solid/liquid boundary is determined (step S9-1). Based on the results of the solid/liquid boundary measurements, the three apexes of an angular crystal is determined (step S9-2). To compute the apex P1 shown in FIG. 10C, for example, according to this technique, the differential values of the image are checked starting from the left of the position. In this case, in the region to the left of P1, the differential values are almost constant. However, to the right of the apex P1, there more than two points whose values are very much larger. One of these apex points is P1. Finally, the coordinate values of the apexes P1, P2 and P3 (x1, y1), (x2, y2) and (x3, y3) are determined, and as shown in FIG. 10D, the lengths of the two perimeter are computed using the usual triangle formula (step S9-3).

At this time, the operator decides whether to continue or stop the measurement step on the basis of the image output on the TV monitor 42 (step S8-10). If it is to be stopped (step S8-1 1), the process is stopped at this point, and if it is to be continued (step S8-12), the program step returns again to the revolution count of th e pull rod 4 and the phase measurement step S8-11.

After completing the observation and size measurement on one still image, if it is desired to change the position of the crystal to be observed, image sampling circuit 39 shifts sampling by an amount equivalent to the phase angle. For example, if sampled image is recorded every 1 second on the crystal rotating at a speed of 1 revolution per second, every image recorded would be at the same location of the crystal. If the sampling rate is changed to 1.25 seconds, the images recorded would be separated by a phase difference of 90 degrees. When the sampling rate is returned to 1 second, then the image existing at that time will be recorded every time. As explained above, the sampling rate is determined by the rotational speed of the pull rod 4, but without the phase angle adjustment, the observation location cannot be selected at will. Therefore, by permitting the operator to set the phase angle as needed, the operator is able to observe a still image of any location of the growing crystal or to obtain different images at the same location.

The features of the apparatus 1 will be summarized below. The apparatus 1 is designed so that a crucible 3 is surrounded by a heater 5, and the top portion of the crucible 3 is covered with an insulation member 6. Therefore, during the growth process of the crystal, there is a large amount of heat loss through the first and second transparent plates. To compensate for the heat loss, the heater 5 supplies a large quantity of heat to produce the temperature required for the growth of the crystal. That is, the large heat loss through the plates 7, 8 are supplanted with a large heat supply from the heater 5. The result is that, compared with the conventional design of crystal growing apparatus in which the upper portion of the crucible is covered with an insulation material, the temperature at the heater 5 increases by 90° C., and the temperature of the insulation 6 increases by about 15° C., for example, and the temperature gradient inside the crucible 3 increases by ten fold from 0.5° to 5.0° C. Furthermore, the planar distribution of temperature on the melt surface becomes concentric, thus eliminating local distortion. Therefore, compared with the conventional apparatus, it becomes possible to suppress nucleation of stray crystals and reducing the formation of floating debris significantly, thus leading to a substantially improved quality of the grown crystal.

Further, the apparatus is provided with a crystal illumination mechanism 9 which can radiate visible light, and in conjunction with the first and second transparent plates 7, 8 which act as a peek window, therefore, reflected visible light or infrared radiation can be used to produce an image on the CCD camera 37, which permits the operator to readily observe the process of crystal growth. The ambient atmosphere during the crystal growth period is made to flow from the top to bottom section of the chamber in the space between the center hole of the first and second transparent plates 7, 8 and the pull rod 4. By providing fins 4a in the region of the pull rod 4 between the plates 7, 8, the gas flows underneath the plates 7, 8 from the center region towards the peripheral region of the plates 7, 8. Especially, the lower surface of the plate 7 is always protected by flowing gas which does not contain vapors released from the melt M. It should also be noted that the second transparent plate 8 acts as an insulation member for the first transparent plate 7.

These two effects are superimposed upon one another to prevent fogging on the plates 7, 8, thereby providing clear images of the growing crystal over a prolonged period of operation of the apparatus 1.

The apparatus 1 is further provided with a crystal size determination mechanism 45. The mechanism 45 is able to automatically measure the perimeter length of a square-shaped crystal, therefore, the operator only needs to examine an image on the TV monitor 42 to determine the perimeter length of a growing crystal. It also permits detailed continual observation of the conditions of crystal growth, including the polycrystal formation and floating debris in the vicinity of the growing crystal.

It should be noted that the various elements of the apparatus 1 explained above can be modified without departing from the principle of thermal design disclosed in the present invention. For example, instead of making the insulation member 6 from one type of material, it is permissible to make only that section of the insulation member 6 which comes into contact with the first transparent plate 7 from a material of higher thermal conductivity. By doing so, it is possible to retain the temperature of the first transparent plate 7 at a higher temperature, thereby preventing fogging on the plate 7. When the crystal illumination mechanism used visible light, it is desirable to place more than 4 reflective mirrors equidistantly around the pull rod to reflect light from a visible light source. Further, instead of the prism 29, the optical path changing device may utilize any device, such as a mirror, which reflect and bend the light path at a desired angle. It is also permissible to alter the actual construction for the gas passage device for the ambient atmosphere and the crystal size determination mechanism. It is clear that the present apparatus is applicable to other types of materials such as semiconductors, such as silicon, in addition to manufacturing of high temperature oxide superconductor crystals.

What is claimed is:

1. A crystal manufacturing apparatus for growing a crystal on a seed crystal by pulling said seed crystal from a melt contained in a crucible comprising:

a cylindrical chamber having said crucible disposed coaxially within a chamber space;

a cylindrical heater coaxially surrounding said crucible;

an insulation member, having a center hole, disposed so as to divide said chamber into upper and lower sections;

transparent plates, having a center hole, disposed on said insulation member so as to cover over said center hole of said insulation member; and a pulling rod disposed centrally in said cylindrical chamber so as to pass through said center hole of said transparent plates.

2. A crystal manufacturing apparatus as claimed in claim 1, further comprising a crystal illumination means for emitting light to illuminate a growing crystal.

3. A crystal manufacturing apparatus as claimed in claim 2, wherein said crystal illumination means comprises:

a light source for emitting light;

a glass fiber transparent to said light, whose one end is in optical contact with said light source;

an illumination plate attached to another end of said glass fiber;

a sapphire fiber optically aligned with said illumination plate in a non-contacting manner with said illumination plate for transmitting said visible light; and a cooling tube surrounding said glass fiber for circulating water to cool said glass fiber.

4. A crystal manufacturing apparatus as claimed in claim 2, wherein said apparatus is provided with a crystal size determination means for measuring a dimension of a growing crystal having a non-circular shape.

5. A crystal manufacturing apparatus as claimed in claim 4, wherein said crystal size determination means comprises:

an optical path changing means for bending an optical path of infrared radiation emitted from said growing crystal and said melt and for bending an optical path of said visible light passed though said transparent plates; and a crystal size determination device for determining dimensions of said growing crystal by receiving infrared radiation and reflected light which passed through said optical path changing device to form an image of said growing crystal, and outputting said image and measurement data of said growing crystal having a non-circular shape.

6. A crystal manufacturing apparatus as claimed in claim 5, wherein said crystal size determination means comprises:

an electro-optic recording device for receiving infrared radiation and reflected light which have passed through said optical path changing means so as to form an image of said growing crystal having a non-circular shape;

an image processing section for sampling said image of said growing crystal in synchronization with a rotational speed of said pulling rod so as to form a still image of said growing crystal, and for performing binary processing of said still image; and an output device for outputting results of image processing produced by said image processing section.

7. A crystal manufacturing apparatus as claimed in claim 6, wherein said crystal size determination device is provided with a phase angle setting device for setting a phase angle for a revolving growing crystal having a non-circular shape.

8. A crystal manufacturing apparatus as claimed in claim 6, wherein said crystal size determination device is provided with an infrared transmitting filter in an optical path between said optical path changing device and said electro-optic recording device.

9. A crystal growing apparatus as claimed in claim 5, wherein said optical path changing means is a prism having a slit for enabling said pulling rod to pass through.

10. A crystal manufacturing apparatus as claimed in claim 1, wherein said apparatus is provided with a crystal size determination means for measuring a dimension of a growing crystal having a non-circular shape grown on said seed crystal.

11. A crystal manufacturing apparatus as claimed in one of claims 1 to 8, wherein said apparatus is provided with an ambient atmosphere sweeping means for admitting an ambient atmosphere from a top region and discharging from a bottom region of said chamber.

12. A crystal manufacturing apparatus as claimed in claim 1, wherein at least a portion of said pulling rod is located between said transparent plates, said portion having integral fins to allow gas supplied from a gas entry port to flow between said pulling rod and said center holes of said transparent plates, and beneath both transparent plates from a center region of said transparent plates radially toward a peripheral region of said transparent plates.

13. A crystal manufacturing apparatus as claimed in claim 11, wherein said apparatus is provided with a first transparent plate on a bottom section of said insulation member and a second transparent plate on a top section of said insulation member acting as a thermal insulation to said first transparent plate.

14. A crystal manufacturing apparatus as claimed in claim 13, wherein said first transparent plate consists of a U-shaped first piece and a fan-shaped second piece having a pick-up bar.

15. A crystal manufacturing apparatus as claimed in claim 13, wherein said first transparent plate is made of sapphire and said second transparent plate is made of quartz glass.

* * * * *

UNITED STATES PATENT AND TRADEMARK OFFICE
CERTIFICATE OF CORRECTION

PATENT NO. : 5,846,323
DATED : December 8, 1998
INVENTOR(S) : Egami et al.

It is certified that error appears in the above-indentified patent and that said Letters Patent is hereby corrected as shown below:

Column 1, Line 28, delete "has", and insert --have--.

Column 1, Line 59, before "common", insert --a--.

Column 2, Line 26, delete "the measurements", and insert --measurement--.

Column 6, Line 7, delete "in FIG. 5".

Column 7, Line 30, delete "CCD 37 camera", and insert --CCD camera 37--.

Column 9, Line 6, delete "th 3", and insert --the--.

Column 9, Line 31, after "plates", insert --7, 8--.

Column 9, Line 50, after "apparatus", insert --1--.

Signed and Sealed this

First Day of June, 1999

Attest:

Q. TODD DICKINSON

*Attesting Officer*    *Acting Commissioner of Patents and Trademarks*